(12) United States Patent
Min et al.

(10) Patent No.: US 6,268,817 B1
(45) Date of Patent: Jul. 31, 2001

(54) DIGITAL-TO-ANALOG CONVERTER

(75) Inventors: Byung Moo Min, Kyonggi-do; Jeong Han Lee, Seoul, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/376,374

(22) Filed: Aug. 18, 1999

(30) Foreign Application Priority Data

Aug. 20, 1998 (KR) .................................................. 98-33814

(51) Int. Cl.$^7$ ...................................................... H03M 1/66
(52) U.S. Cl. ............................................. 341/145; 341/154
(58) Field of Search ..................................... 341/145, 154

(56) References Cited

U.S. PATENT DOCUMENTS

| | | | |
|---|---|---|---|
| 4,543,560 | 9/1985 | Holloway | ............................. 340/347 |
| 5,914,682 | * 6/1999 | Noguchi | ................................ 341/145 |
| 6,133,863 | * 10/2000 | Peng | ..................................... 341/154 |

* cited by examiner

*Primary Examiner*—Howard L. Williams
(74) *Attorney, Agent, or Firm*—Fleshner & Kim, LLP

(57) ABSTRACT

A reliable digital-to-analog converter includes a coarse stage having $2^M-1$ number of first resistors and a fine stage coupled to the coarse stage in series for converting a digital signal of K(K=M+N) bit to an anoalog signal, where M equals the number of most significant bits and N equals the number of least significant bits. The fine stage coupled in series to the coarse stage has an equivalent resistance substantially equal to a resistance of any one of the first resistors of the coarse stage.

13 Claims, 3 Drawing Sheets

DIGITAL-TO-ANALOG CONVERTER

BACKGROUND OF THE INVENTION

1. Field of the Invention

The present invention relates to a digital-to-analog converter, and more particularly, to a digital-to-analog converter which improves reliability of a device.

2. Background of the Related Art

Generally, in a digital-to-analog converter, a resistor string for obtaining analog corresponding to digital has limitation in the number of bits. In other words, to obtain analog corresponding to digital of 10 bits, for example, $2^{10}$, i.e., 1024 resistors are required. In this case, a resistor string has limitation in the number of bits in view of an occupying area and the like. For this reason, to obtain analog corresponding to digital of K bit more than constant limitation, two stages, i.e., a coarse stage and a fine stage are used. Assuming that K(bit)=M+N, the coarse stage for K(bit) has $2^M$ number of resistors and the fine stage for the same has $2^N$ number of resistors, wherein M is the number of the most significant bits (MSB) in limitation of the resistor string and N is the number of the other least significant bits (LSB).

When converting digital of K(K=M+N) bit to analog, as shown in FIG. 1, a related art digital-to-analog converter includes a coarse stage 11, a buffer 12, a fine stage 13, and an output buffer 14.

The coarse stage 11 includes $2^M$ number of first resistors 15 and first and second select lines 16 and 17. The first resistors 15 are connected in series between a reference voltage Vref and a ground terminal. The first and second select lines 16 and 17 include a plurality of first and second switch terminals which are alternately connected between the first resistors 15 and the reference voltage, between each of the first resistors 15 and each of the first resistors 15, and between the first resistors 15 and the ground terminal. The first and second select lines 16 and 17 are controlled by an MSB decoder (not shown).

The buffer 12 includes first and second operational (OP) amplifiers 18 and 19 connected to the first and second select lines 16 and 17, respectively.

The fine stage 13 includes $2^N$ number of second resistors 20 and a third select line 21. The second resistors 20 are connected in series between output lines of the OP amplifiers 18 and 19. The third select line 21 includes third switch terminals connected between the second resistors 20 and the first OP amplifier 18, between each of the second resistors 20 and each of the second resistors 20, and between the second resistors 20 and the second OP amplifier 19. The third select line 21 is controlled by an LSB decoder (not shown).

Each of the first resistors 15 and each of the second resistors 20 have the same value as each other.

The output buffer 14 includes a third OP amplifier 22 connected to the third select line 21.

The operation of the related art digital-to-analog converter will be described below.

The coarse stage 11 has a plurality of voltages of 0V to the reference voltage by means of the first resistors 15. In this state, if a conversion signal for converting digital of K(K=M+N) bit to analog is input to the digital-to-analog converter, the coarse stage 11 selectively turns on the first and second switch terminals of the first and second select lines 16 and 17, corresponding to the MSB of the input conversion signal in the MSB decoder. The selected value is then output to the buffer 12.

The outputs of the selected first and second select lines 16 and 17 are input to the first and second OP amplifiers 18 and 19 of the buffer 12. The output voltages of the first and second OP amplifiers 18 and 19 are output to the fine stage 13 as top and bottom voltages of the fine stage 13, respectively.

Subsequently, the fine stage 13 has a plurality of voltages within the range of the voltage of the first OP amplifier 18 to the voltage of the second OP amplifier 19 by means of the second resistors 20. The fine stage 13 selectively turns on the third switch terminals of the third line 21, corresponding to the LSB of the input conversion signal in the LSB decoder. The selected value is then output to the output buffer 14.

The output buffer 14 outputs outside an analog signal corresponding to the input digital signal through the third OP amplifier 22 connected to the third select line 21.

However, the related art digital-to-analog converter has several problems.

Since the output voltage of the coarse stage, which is determined by respectively selecting the first and second select lines by means of the MSB decoder is output as the top and bottom voltages of the fine stage through the first and second OP amplifiers, the top and bottom voltages of the fine stage are varied due to variation of the offset voltage of the OP amplifiers. This results in that error occurs in the fine stage.

SUMMARY OF THE INVENTION

Accordingly, the present invention is directed to a digital-to-analog converter that substantially obviates one or more of the problems due to limitations and disadvantages of the related art.

An object of the present invention is to provide a digital-to-analog converter in which a resistor connects $2^M-1$ number of first resistors of a coarse stage with a fine stage in series when converting digital of K(K=M+N) bit to analog, so that reliability of a device can be improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a digital-to-analog converter for converting a digital signal of K(K=M+N) bit, in which the number of high bits is M and the number of low bits is N, into an analog signal by a decoder, according to the present invention, includes a coarse stage consisting of first resistor strings having $2^{M-1}$ resistors connected in series with the same size between a reference voltage and a ground terminal, for outputting a first output value corresponding to the M by the decoder, a fine stage formed within the coarse stage between the first resistor strings and the ground terminal to be equivalent to any one of the first resistor strings, for outputting a second output value corresponding to the N by the decoder, a buffer consisting of first and second OP amplifiers which respectively receives the first and second output values, for matching the first and second output values, and an adder for adding outputs of the buffer and outputting an analog signal corresponding to an input digital signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
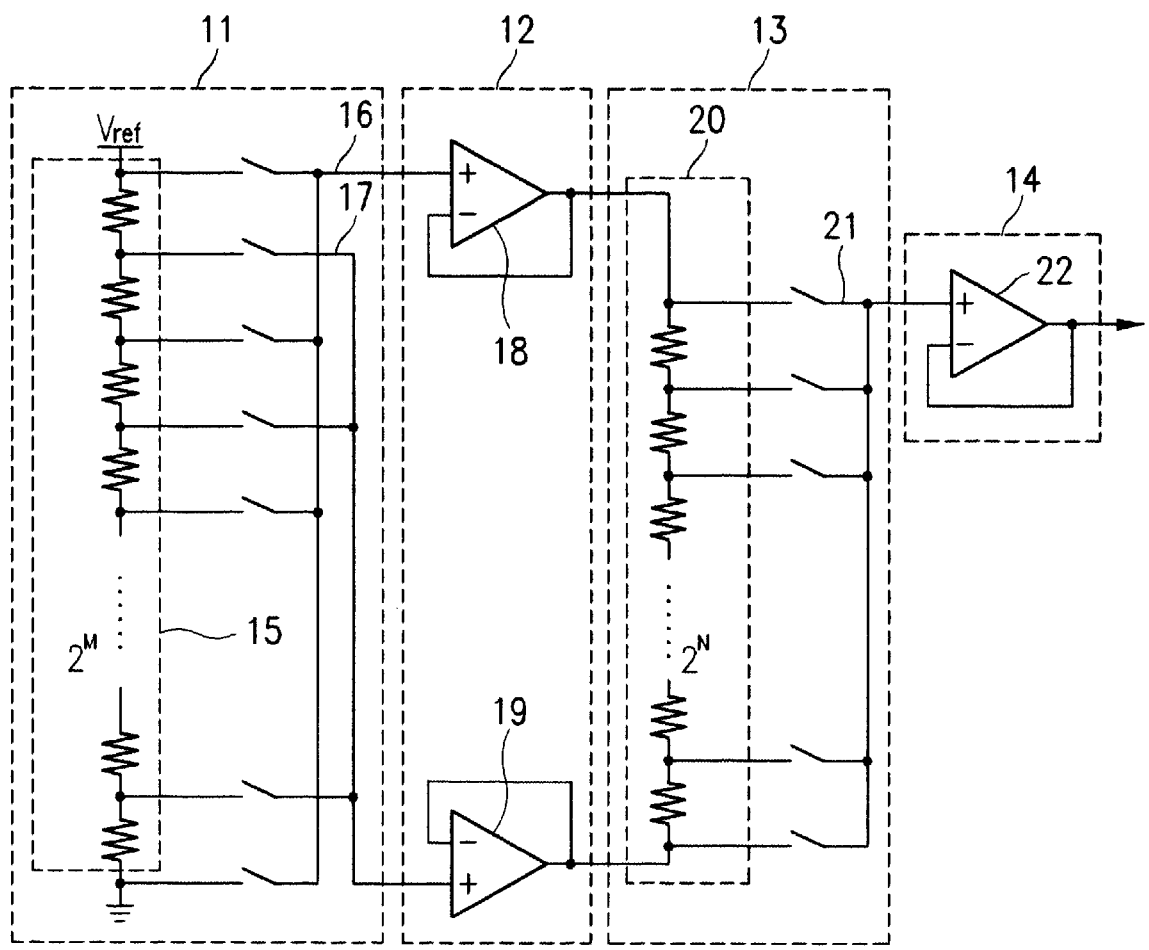
FIG. 1 is a circuit diagram illustrating a related art digital-to-analog converter.
Figure 2:
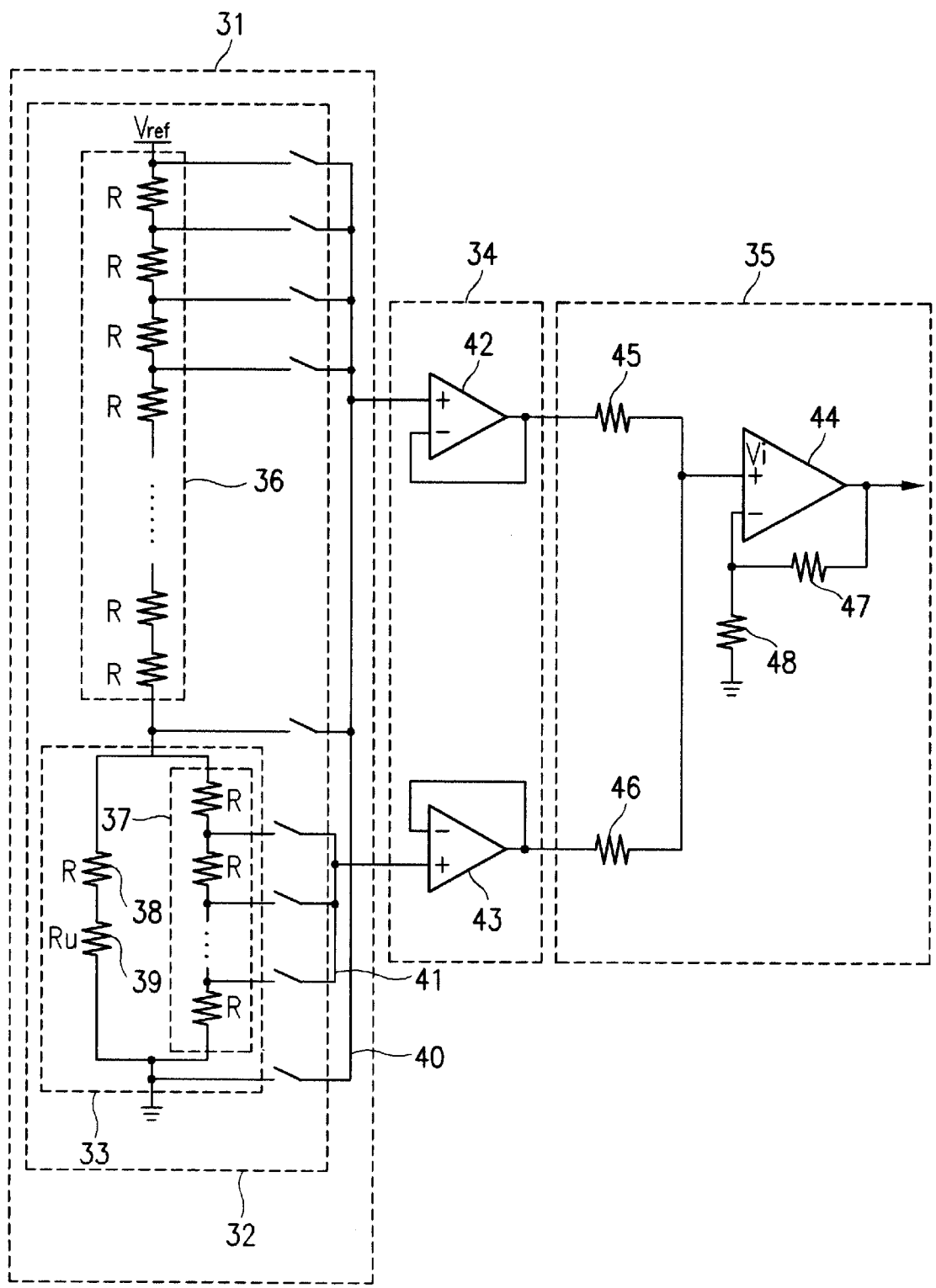
FIG. 2 is a circuit diagram illustrating a digital-to-analog converter according to the embodiment of the present invention.
Figure 3:
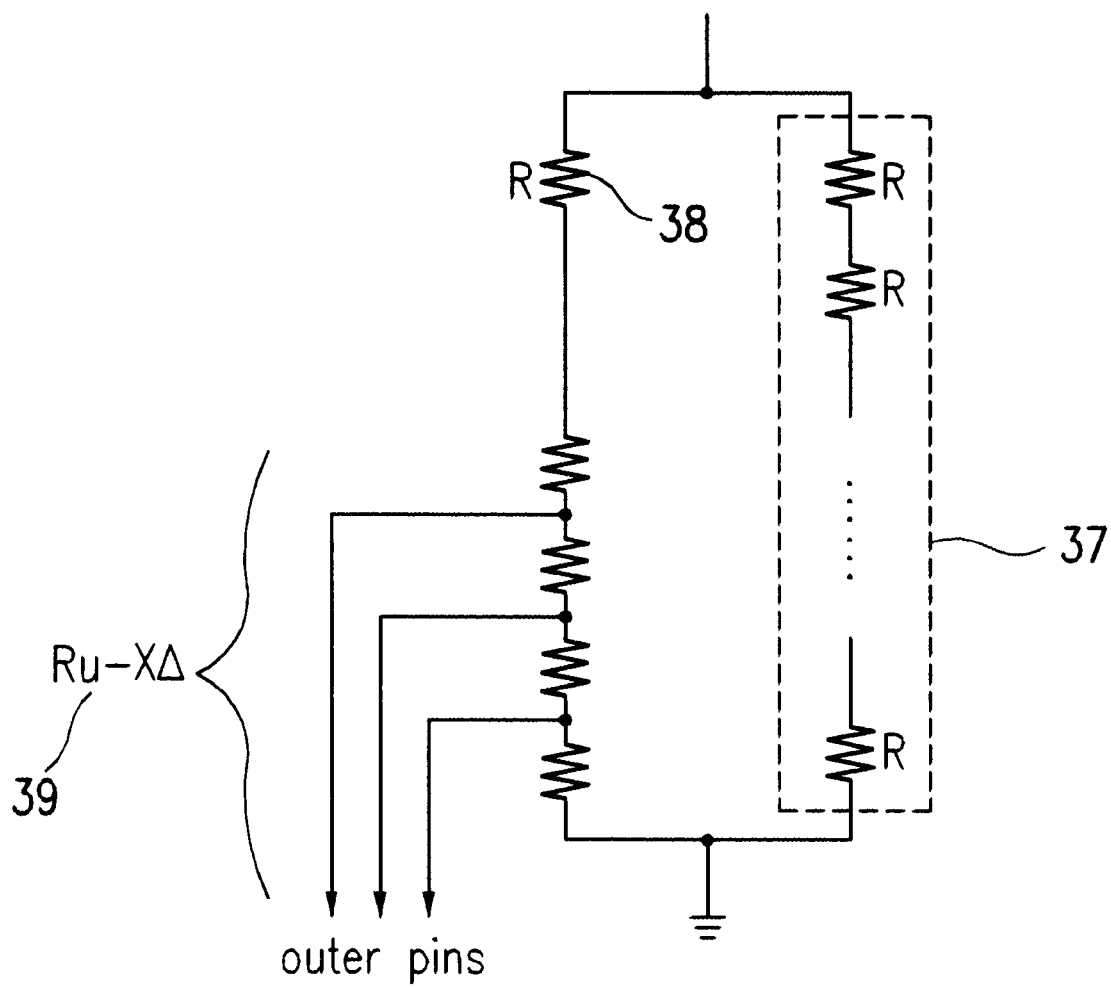
FIG. 3 is a circuit diagram illustrating a method for controlling a resistor value of a digital-to-analog converter according to the embodiment of the present invention.

FIG. 2 is a circuit diagram illustrating a digital-to-analog converter according to the embodiment of the present invention. FIG. 3 is a circuit diagram illustrating a method for controlling a resistor value of a digital-to-analog converter according to the embodiment of the present invention.

As shown in FIG. 2, the digital-to-analog converter according to the present invention includes a resistor portion 31, a buffer 34, and an adder 35. The resistor portion 31 includes a coarse stage 32, a fine stage 33, a first select line 40 and a second select line 41.

The coarse stage 32 has $2^M-1$ number of first resistors 36 between a reference voltage and a ground terminal, and the fine stage 33. The first resistors 36 and the fine stage 33 are respectively connected in series.

The first select line 40 includes a plurality of first switch terminals respectively connected between the reference voltage and the first resistors 36, between each of the first resistors 36 and each of the first resistors 36, between the first resistors 36 and the fine stage 33, and between the fine stage 33 and the ground terminal. The first select line 40 is controlled by an MSB decoder (not shown).

Further, the fine stage 33 is a resistor equivalent circuit connected in parallel, and includes $2^N$ number of second resistors 37 connected in series between a bottom resistor of the first resistors 36 and the ground terminal, and third and fourth resistors 38 and 39 connected in series. The second resistors 37 and the third and fourth resistors 38 and 39 are connected in parallel.

The second select line 41 includes a plurality of second switch terminals connected between each of the second resistors 37 and each of the second resistors 37. The second select line 41 is controlled by an LSB decoder (not shown).

Each of the first, second, and third resistors 36, 37 and 38 has the same value as one another.

The buffer 34 includes first and second OP amplifiers 42 and 43 respectively connected to the first and second select lines 40 and 41.

Subsequently, the adder 35 has a non-inverting structure. The adder 35 includes a third OP amplifier 44, fifth, sixth, seventh, and eighth resistors 45, 46, 47 and 48 and outputs outside a final output voltage, i.e., an analog signal corresponding to an input digital signal.

Furthermore, the adder 35 may have an inverting structure or a switched capacitor structure instead of the non-inverting structure. In this case, the adder 35 obtains a result similar to the non-inverting structure. For example, in case of the inverting structure, an inverted signal of an analog signal is output outside.

A positive input terminal of the third OP amplifier 44 receives output voltages of the first and second OP amplifiers 42 and 43 through the fifth and sixth resistors 45 and 46. A negative input terminal of the third OP amplifier 44 is connected to a node between the seventh and eighth resistors 47 and 48 which are connected between a final output terminal and the ground terminal.

The operation of the digital-to-analog converter according to the embodiment of the present invention will be described below.

When converting digital of K(K=M+N) bit to analog, an equivalent resistor of the fine stage 33 has the same value as one of the first resistors 36. Thus, the resistor value of the fourth resistor 39 is $R/(2^N-1)$. At this time, the total resistor value of the fine stage 33 is $R=(2^N-1) \times R_U$ ($R_U$ is equal to the resistor value of the fourth resistor 39).

The total resistor value of the fine stage 33 is usually adjusted by obtaining the resistor value of the fourth resistor 39. However, as shown in FIG. 3, 2X number of resistors Ru–XΔ smaller than the resistor value of the fourth resistor 39 are connected in series and outer pins are connected to each node between the resistors Ru–XΔ, respectively. Then, to obtain the same resistor value as that of the fourth resistor 39, the resistor value of each outer pin is checked and the outer pin having the same resistor value as that of the fourth resistor 39 is selected.

At this time, Δ value is as less as Ru/10, and the number of each node between the resistors does not exceed the number of pins of a chip.

At the above state, if a conversion signal is input to the digital-to-analog converter, the resistor portion 31 selectively turns on the first switch terminals of the first select line 40, corresponding to the MSB of the input conversion signal in the MSB decoder, and outputs the selected value to the first OP amplifier 42 of the buffer 34.

The fine stage 33 selectively turns on the second switch terminals of the second select line 41, corresponding to the LSB of the input conversion signal in the LSB decoder and outputs the selected value to the second OP amplifier 43 of the buffer 34.

Subsequently, the buffer 34 matches inputs of the first and second OP amplifiers 42 and 43 and outputs the matched value to the adder 35.

The positive input terminal of the adder 35 receives the output voltages of the first and second OP amplifiers 42 and 43 through the fifth and sixth resistors 45 and 46. Since both the positive input terminal and the negative input terminal internally include a virtual short circuit, the potential Vi of the positive input terminal is maintained at the negative input terminal, so that the negative input terminal has the potential of Vi. In addition, current which flows to the eighth resistor 48 between the input terminal of Vi potential and the ground terminal flows to only the seventh resistor 47 due to infinite input impedance of the OP amplifier. Thus, the voltage Vi of the negative input terminal plus the voltage of eighth resistor/seventh resistor x feedback current which flows between the output terminal of the third OP amplifier and the negative input terminal thereof become the final output voltage.

The digital-to-analog converter of the present invention has the following advantages.

Since the digital-to-analog converter of the present invention includes one resistor portion of the coarse stage for connecting the $2^M-1$ number of the first resistors with the fine stage in series when converting digital of K(K=M+N) bit to analog, the top and bottom voltages of the fine stage are determined without passing through the OP amplifiers. Thus, the top and bottom voltages of the fine stage are not affected by variation of the offset voltage of the OP amplifiers. This reduces error of the fine stage, thereby improving reliability of the device.

It will be apparent to those skilled in the art that various modifications and variations can be made in the digital-to-analog converter according to the present invention without departing from the spirit or scope of the invention. Thus, it is intended that the present invention covers the modifications and variations of the invention provided they come within the scope of the appended claims and their equivalents.

What is claimed is:

1. A digital-to-analog converter (DAC) for converting a digital signal into an analog signal, comprising:

a coarse stage having a plurality of first resistors coupled in series, each of the plurality of resistors having a first resistance value, to output a first output value;

a fine stage coupled in series with the coarse stage, said fine stage having an equivalent second resistance value which is substantially the same as the first resistance value of any one of the plurality of first resistors of the coarse stage, said first stage outputting a second output value;

a buffer receiving the first and second output values to output matched first and second output values; and an adder that adds the matched first and second output values to output the analog signal.

2. The DAC of claim 1, wherein the digital signal comprises K(K=M+N) bits, where M is a number of most significant bits and N is a number of least significant bits.

3. The DAC of claim 1, wherein the plurality of first resistors comprises $2^{M-1}$ number of first resistors.

4. The DAC of claim 1, wherein the fine stage includes:

a plurality of second resistors coupled in series;

a third resistor and a fourth resistor coupled in series, which are coupled in a parallel with the plurality of second resistors.

5. The DAC of claim 4, wherein the plurality of second resistors comprises $2^N$ number of second resistors.

6. The DAC of claim 4, wherein the first, second and third resistors have a same resistance value R.

7. The DAC of claim 6, wherein the fourth resistor has a resistance value equal to $R/(2^N-1)$.

8. The DAC of claim 1, further comprising a decoder responsive to most significant bits of the digital signal for controlling the coarse stage output of the first output value, and the decoder being responsive to the least significant bits of the digital signal for controlling the fine stage output of the second output value.

9. The DAC of claim 1, wherein the coarse stage further comprises a plurality of first switches, one of the first switches being coupled between a reference voltage and the buffer, another one of the first switch being coupled between a ground voltage and the buffer, and another one of the first switch being coupled between a serial connection of the coarse stage and the fine stage and the buffer, wherein each of the remaining first switches are coupled between adjacent first resistors and the buffer.

10. The DAC of claim 4, wherein the fine stage further comprise a plurality of second switches, a corresponding second switch being coupled between adjacent second resistors and the buffer.

11. The DAC of claim 1, wherein the buffer includes:

a first operational amplifier having positive and negative inputs and an output, the positive input being coupled to receive the first output value from the coarse stage, and the negative input being coupled to the output of the first operational amplifier, and a second operational amplifier having positive and negative inputs and an output, the positive input being coupled to receive the second output value from the fine stage and the negative input being coupled to the output of the second operational amplifier.

12. The DAC of claim 1, wherein the adder has a non-inverting structure.

13. The DAC of claim 1, wherein the adder comprises:

a fifth resistor coupled for receiving the first matched output value of the buffer;

a sixth resistor coupled for receiving the second matched output value of the buffer;

a third operational amplifier having positive and negative inputs and an output, the fifth and sixth resistors being coupled to the positive input of the third operational amplifier;

a seventh resistor being coupled between the output and the negative input of the third operational amplifier; and an eighth resistor being coupled to the negative input of the third operational amplifier.

* * * * *